(12) United States Patent
Sakai et al.

(10) Patent No.: US 6,824,037 B2
(45) Date of Patent: Nov. 30, 2004

(54) BONDING DEVICE

(75) Inventors: Noriyasu Sakai, Gunma (JP); Kouji Seki, Gunma (JP); Toshihiko Higashino, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/201,064

(22) Filed: Jul. 22, 2002

(65) Prior Publication Data

US 2003/0019906 A1 Jan. 30, 2003

(30) Foreign Application Priority Data

Jul. 25, 2001 (JP) .................................. P. 2001-225154

(51) Int. Cl.[7] .......................... B23K 1/06; B23K 35/00; B23K 3/04
(52) U.S. Cl. .................. 228/4.5; 228/105; 228/218; 228/1.1; 228/110.1; 228/180.5; 219/85.16; 219/85.18
(58) Field of Search ................... 228/105, 103, 228/4.5, 180.1, 1.1, 110.1, 180.5, 218; 219/85.18, 85.1, 85.16, 85.22

(56) References Cited

U.S. PATENT DOCUMENTS

| | | | | |
|---|---|---|---|---|
| 4,575,602 A | * | 3/1986 | Sakurai | .................. 219/56.21 |
| 4,976,393 A | * | 12/1990 | Nakajima et al. | ............ 228/111 |
| 5,110,032 A | * | 5/1992 | Akiyama et al. | ............ 228/102 |
| 5,285,949 A | * | 2/1994 | Okikawa et al. | ......... 228/179.1 |
| 5,538,176 A | * | 7/1996 | Hasegawa et al. | ....... 228/180.5 |
| 6,068,174 A | * | 5/2000 | Ball et al. | .................... 228/4.5 |
| 6,234,376 B1 | * | 5/2001 | Wicen | ..................... 228/180.5 |

FOREIGN PATENT DOCUMENTS

JP     63029535 A   *   2/1988

* cited by examiner

*Primary Examiner*—Kiley Stoner
*Assistant Examiner*—Kevin L McHenry
(74) *Attorney, Agent, or Firm*—Fish & Richardson P.C.

(57) ABSTRACT

The present invention solves a problem with a wire bonding device, that during a wire bonding process, a cover at the periphery of a working hole warps upward to cause inadvertent sparking to occur across the cover that has warped upwards and a torch electrode. This invention's bonding device 21 provided with recognition device is characterized in that insulation treatment is applied to a part 231 of a cover 23 positioned at the periphery of a working hole 24. The interior of a working region is kept, for example, at 230° C. by a heater 30 inside a setting base 22, and by being placed under high temperature constantly, a part 471 of cover 23 warps upwards. However, since insulation treatment is applied to part 231 of cover 23, a bonding device can be realized with which inadvertent sparking between a torch electrode 28 will not occur.

19 Claims, 7 Drawing Sheets

PRIOR ART

BONDING DEVICE

BACKGROUND OF THE INVENTION

1. Field of the Invention

This invention concerns a bonding device, with which inadvertent sparking across a cover, which forms a working region, and a torch electrode is prevented.

2. Description of the Related Art

In prior processes with semiconductor devices, wire bonding to mounting parts formed on a lead frame was performed according to each mounting part, and as an embodiment therefor, a bonding device for such wire bonding is disclosed for example in Japanese Unexamined Patent Publication No. Sho-63-29535.

As shown in FIG. 7, a transistor lead frame 2, to which a chip 10 is attached, is set on a heating block part 1. A bonding arm 3 is disposed above lead frame 2 on heating block 1 and a capillary 4 is disposed at the tip of bonding arm 3. A wire 5 is disposed in this capillary 4 and a torch electrode 6, for forming a ball from wire 5, is disposed near capillary 4.

This thermocompression type bonding device is provided with a wire bonding position recognition part 7 and a bonding head driving part 8 as well as with a local heating device 9, which is set to operate in linkage with the operation of bonding head driving part 8 in the X and Y directions and is for heating the bonding part locally. A laser beam device may for example be used as this local heating device 9.

The operations shall now be described. Bonding head driving part 8 is made to move, as programmed in advance in accordance with information from wire bonding position recognition part 7, to lead frame 2 that has been heated by heating block 1, local heating device 9 is made to operate just during the bonding process to perform ball bonding while compensating for inadequate heat on chip 10, capillary 4 is thereafter moved to the lead frame 2 side, local heating device 9 is made to operate again just during the bonding process to perform stitch bonding while compensating for inadequate heat at the lead frame 2 side, and then torch electrode 6 is made to form a ball part at the tip of a wire 5 that has been cut.

Ball bonding is then performed on the other electrode of chip 10 while making local heating device 9 operate just during bonding to compensate for inadequate heat at chip 10, capillary 4 is thereafter moved to the lead frame side, local heating device 9 is made to operate again just during the bonding process to perform stitch bonding while compensating for inadequate heat at the lead frame side, and then torch electrode 6 is made to form a ball part at the tip of a wire 5 that has been cut. Since bonding is thus performed while compensating for inadequate heat at the bonding part, a high quality wire bond is obtained. A wire bond of even higher quality can be obtained by using ultrasonic waves in combination.

Also though the case of a transistor chip was described with the above-described embodiment, this invention is not limited thereto and the chip may be a diode, IC, etc., and the invention can thus be applied as a wire bonder for any semiconductor device.

In the case where mounting parts are formed on a completely punched lead frame 2 as has been described above, just the mounting parts need to be heated, for example, to approximately 250° C. during wire bonding. That is, since the entirety of lead frame 2 is not constantly in a high temperature state and wire bonding could be performed by partial heating, problems, such as the oxidation of lead frame 2 did not have to be considered with the bonding device described above.

Though details shall be given with the description of an embodiment of the present invention, in the case where a cluster block, having a plurality of mounting parts within a small area, is formed on a lead frame, etc., the lead frame, etc., will be kept at a high temperature state until all of the wire bonding processes for a single cluster block has been completed. There was thus the problem that a lead frame, etc., with a cluster block becomes oxidized due to being placed in the abovementioned high temperature state over a long period of time. The abovementioned oxidation of lead frame 2, etc., must thus be prevented for example by placing the lead frame in the high temperature state in a space filled with an inert gas, such as nitrogen gas.

In order to form this space, an inert-gas-filled space must be formed above the working base on which the lead frame is set and furthermore, a working hole for recognition and wire bonding must be formed above this space. In this case, the inert gas becomes heated to a high temperature within the space and escapes to the exterior from the working hole due to the ascending air current, and in this process, the peripheral ends of the cover that form the working hole become warped upwards due to the influence of high temperature, etc. As a result, inadvertent sparking occurs across torch electrode 6 and the cover that has warped upwards and prevents the formation of a ball part at the tip of wire 5.

SUMMARY OF THE INVENTION

This invention has been made in view of the above-described problem of the prior art, and this invention's bonding device comprising: a substrate setting base, having a heating function; a cover, which covers a working region from above the abovementioned substrate setting base; a working hole, provided in the upper surface of the abovementioned cover; an illumination, disposed above the abovementioned working hole; a capillary and a torch electrode, disposed at the side face of the abovementioned illumination; and a pattern recognition camera, disposed inside a lens barrel provided above the abovementioned illumination; wherein the abovementioned cover has the periphery of the abovementioned working hole subject to insulation treatment to prevent sparking across the abovementioned torch electrode and the abovementioned cover.

Preferably with this invention's bonding device, the abovementioned cover has only the periphery of the abovementioned working hole with the side edge closest to the tip of the abovementioned torch electrode subject to insulation treatment.

Also preferably with this invention's bonding device, insulation treatment of the abovementioned cover is carried out by attachment of a heat-resistant insulating tape.

Also preferably with this invention's bonding device, the abovementioned heat-resistant insulating tape is tape comprising a fluororesin.

Also preferably with this invention's bonding device, insulation treatment of the abovementioned cover is carried out by the forming of an insulating layer comprising a fluororesin.

Also preferably with this invention's bonding device, insulation treatment of the abovementioned cover is carried out by adhesion of an insulating plate.

Also preferably with this invention's bonding device, the abovementioned insulating plate is a ceramic plate.

Also preferably with this invention's bonding device, the side that is punched in the process of forming the abovementioned working hole is positioned at the rear side of the abovementioned cover.

Also in order to solve the above-described problem this invention provides a bonding device comprising: a substrate setting base, having a heating function; a cover, which covers a working region from above the abovementioned substrate setting base; a working hole, provided in the upper surface of the abovementioned cover; an illumination, disposed above the abovementioned working hole; a capillary and a torch electrode, disposed at the side face of the abovementioned illumination; and a pattern recognition camera, disposed inside a lens barrel provided above the abovementioned illumination; wherein the abovementioned cover is arranged by covering the upper surface of a damper with a conductive plate and the abovementioned conductive plate has the periphery of the abovementioned working hole, provided in the abovementioned conductive plate, subject to insulation treatment to prevent sparking across the abovementioned torch electrode and the abovementioned conductive plate.

Also preferably with this invention's bonding device and circuit device manufacturing method, the abovementioned conductive plate is made from stainless steel.

This invention's bonding device is characterized in that with the conductive plate, which makes up the cover that covers the working region above the above-described substrate setting base, insulation treatment is applied to the periphery of the working hole in the conductive plate. Inadvertent sparking across the above-described conductive plate and the torch electrode, which is caused by upward warping of the conductive plate at the periphery of the above-described working hole, can thus be prevented. A bonding device can thus be realized with which inadvertent sparking can be prevented without obstructing the merits of prevention of oxidation of the surface of a lead frame within the abovementioned working region, improvement of the bonding speed by the moving of the abovementioned working hole, etc.

This invention's bonding device is also characterized in that the side, which is punched in the process of forming the abovementioned working hole in the abovementioned conductive plate, is positioned at the inner surface side of the abovementioned working region. The conductive plate at the periphery of the abovementioned working hole thus warps upward above the abovementioned working region. As a result, the abovementioned working region will not be invaded by the conductive plate at the periphery of the abovementioned working hole, and a bonding device can be realized with which there are no problems of bending of a thin metal wire within the abovementioned working region due to the conductive plate at the periphery of the abovementioned working hole.

DETAILED DESCRIPTION OF THE PREFERRED EMBODIMENTS

This invention's bonding device shall now be described in detail with reference to FIGS. 1 through 6.

With an embodiment of this invention, the recognition device and bonding device act together and are arranged as a bonding device 21 provided with a single recognition device.

Figure 1:
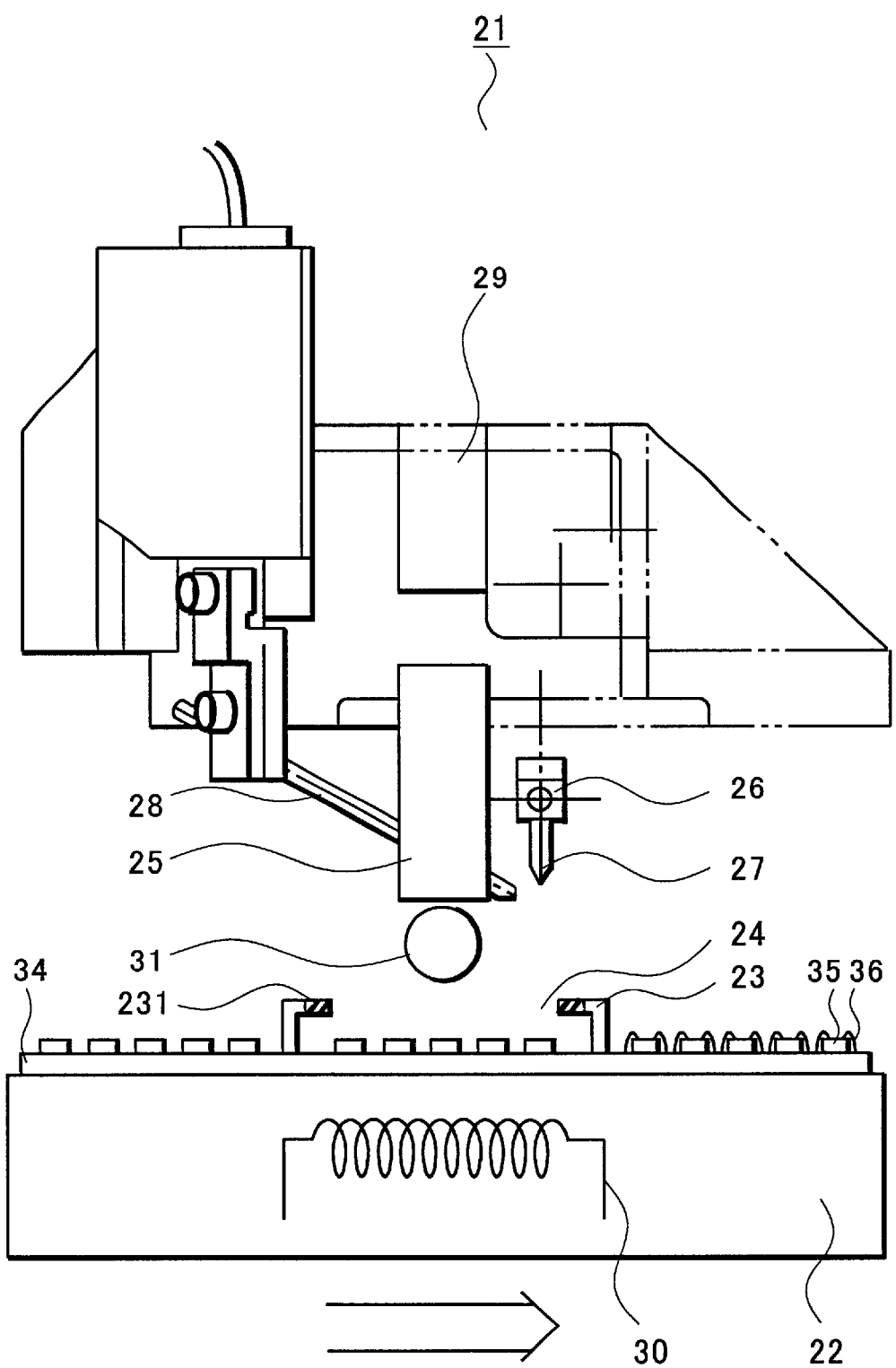
FIG. 1 is a diagram for explaining bonding device provided with recognition device according to the invention.

As shown in FIG. 1, the main structure of bonding device 21 comprises a setting base 22, a cover 23, which covers a working space above setting base 22, a working hole 24, which is provided in the upper surface of cover 23, a ring illumination 25, which is disposed above working hole 24, a bonding arm 26, which is disposed at the side of ring illumination 25, a capillary 27, which is disposed at the tip part of bonding arm 26, a torch electrode 28, which is provided near capillary 27, a lens barrel 29, which is disposed above ring illumination 25, a recognition camera, which, though not illustrated, is installed inside lens barrel 29, and a shimmer prevention blowing mechanism 31. And as a characteristic of this invention, insulation treatment is applied to a peripheral part 231 of cover 23 at which working hole 24 is provided.

The characteristics of the individual structures shall now be described along with their operations.

First, on setting base 22 is set a lead frame 34, which has a plurality of mounting parts, and setting base 22 is provided with a heater 30 function for heating lead frame 34 and thereby improving the wire bonding property. By means of this heater 30, the interior of a working space arranged by setting base 22 and cover 23, can be kept at a high temperature state of, for example, approximately 230° C. during the wire bonding process.

Also, though details shall be given later, apart of cover 23 is formed of a damper 40 and this cover 23 is arranged by putting a lid on the upper face of damper 40 for example by means of a stainless steel plate 47 as shown in FIG. 4. And, for example, nitrogen gas is blown as an inert gas at a rate of 4 liters/minute into cover 23 from clamper 40. This blow-in rate can be varied according to the working application. Working hole 24 is provided on the upper surface of cover 23. Pattern recognition and wire bonding are performed via this working hole 24 in the wire bonding process.

Ring illumination 25 and lens barrel 29 shall now be described. Lens barrel 29 is disposed above ring illumination 25. Lead frame 34 and semiconductor elements 35, which are illuminated by ring illumination 25 via working hole 24, can be recognized by differences in reflectivity. By recognizing this reflected light by means of the recognition camera disposed inside lens barrel 29, pattern recognition of the upper side of lead frame 34 can be performed. Here, by using ring illumination 25 as the illumination, lead frame 34 and semiconductor elements 35 can be illuminated without bias and without giving rise to shadows, thereby enabling pattern recognition to be performed more precisely. Also, thought not illustrated, lens barrel 29 is bent in the middle at an angle of 90 degrees with respect to the surface of setting base 22 and the recognition camera is installed beyond this bent part. A mirror is installed an angle of 45 degrees with respect to the setting base 22 surface at this bent part, and pattern recognition can be performed by this structure.

Here, on lead frame 34, for example 10 rows and 5 columns of mounting parts make up a single cluster block 37 (see FIG. 4), and a plurality of such cluster blocks 37 are formed. The size of working hole 24 is such that enables, for example, 20 mounting parts of 2 rows of a single cluster block 37 to be recognized from above. This working hole 24 is used for pattern recognition, etc. The size of this working hole 24 is not defined in particular but is determined according to the working application and based on the recognition pattern method, etc., of bonding device 21.

Figure 2:
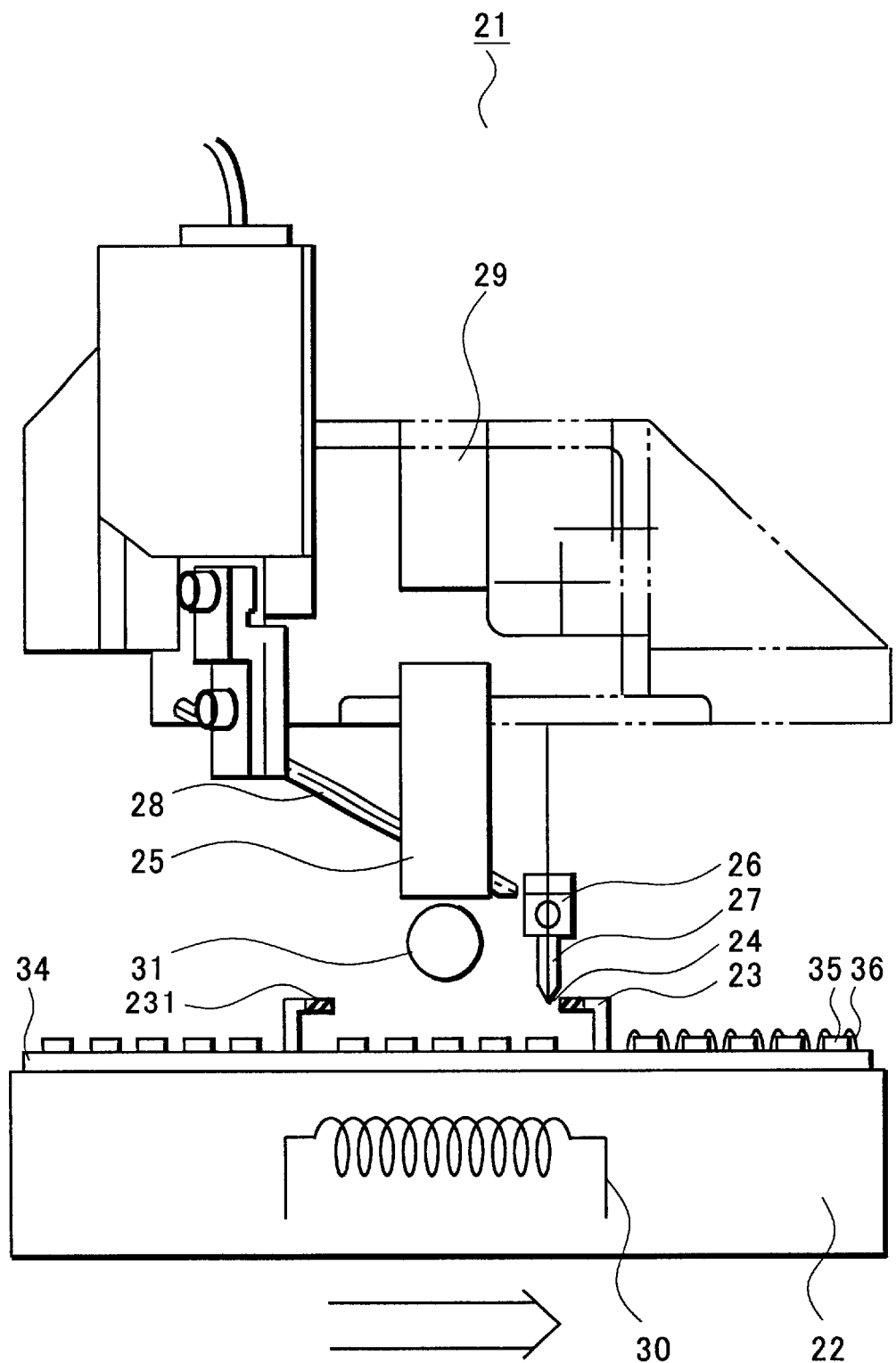
FIG. 2 is a diagram for explaining bonding device provided with recognition device according to the invention.

Next, bonding arm 26, capillary 27, and torch electrode 28 shall be described. As shown in FIG. 2, after pattern recognition, ring illumination 25, bonding arm 26, and capillary 27 move and capillary 27 is positioned above working hole 24. Wire bonding is then performed based on the data obtained by the recognition camera, and capillary 27 enters into cover 23 from working hole 24 to perform wire bonding of the electrode pads of semiconductor elements to the desired electrode patterns. In this process, torch electrode 28 performs stitch bonding and forms a ball 38 (see FIG. 5) at the tip of a thin metal wire that has been cut.

Figure 3:
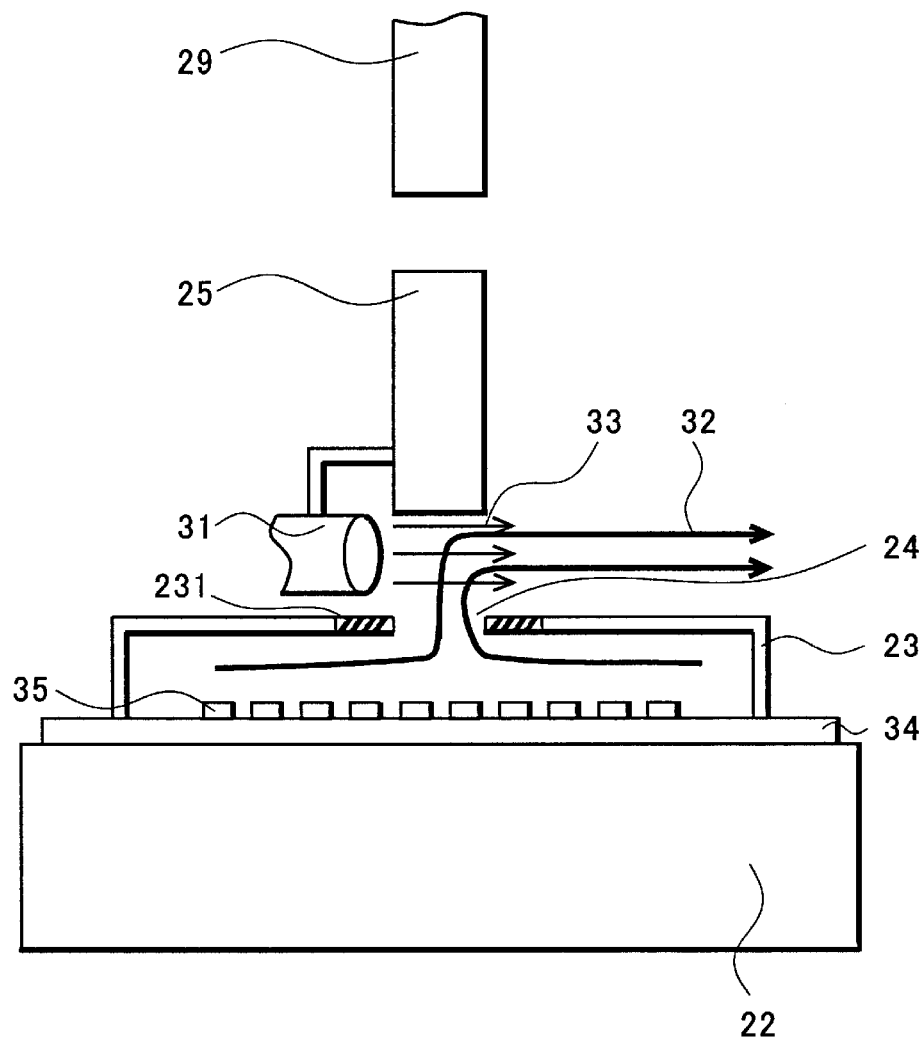
FIG. 3 is a diagram, which shows bonding device provided with recognition device according to the invention in a simplified manner for explanation.

The blow device shall now be described using FIG. 3. FIG. 3 is a schematic view of bonding device 21, which is provided with a recognition device as shown in FIGS. 1 and 2.

As shown in FIGS. 1 through 3, shimmer prevention blow mechanism 31 is disposed between ring illumination 25 and cover 23 and near working hole 24. And from shimmer prevention blow mechanism 31, for example, a nitrogen gas blow 33 of 3 liters/minute is blown over working hole 24 in the horizontal direction with respect to the surface of cover 23. Meanwhile, as has been mentioned above, for example, nitrogen gas is blown at a rate of 4 liters/minute inside cover 23. At the same time, the interior of cover 23 is kept at a temperature for example of 230° C. by heater 30 built into setting base 22. Though the nitrogen gas that is fed in thereafter is, for example, at 70° C., it is heated to 230° C. by the heat from heater 30.

The heated nitrogen gas flows out to the exterior from working hole 24 due to the ascending air current within cover 23, and since the room temperature at this time is, for example, 20° C., shimmer 32, which is substantially that of the nitrogen gas, is caused by the temperature difference between the nitrogen gas and room temperature. As a result, shimmer 32 stagnates below ring illumination 25 and at the inner side of ring illumination 25, causing the recognition precision of the recognition camera to degrade and the wire bonding precision to fall.

However, as shown in FIG. 3, shimmer prevention blow mechanism 31 is disposed immediately to the side of the lower end of ring illumination 25 and moves integrally with ring illumination 25. Shimmer prevention blow mechanism 31 can blow away shimmer 32 which is that of the nitrogen gas from above working hole 24 and the surroundings of illumination ring 25 by means of the blow 33 of, for example, nitrogen gas of 3 liters/minute. Here, since shimmer prevention blow mechanism 31 is disposed immediately to the side of the lower end of ring illumination 25 as has been mentioned above, the air and especially the oxygen in the working room will not become mixed into nitrogen gas 33. Thus although the nitrogen gas 33 from shimmer prevention blow mechanism 31 may enter inside cover 23 from working hole 24, since oxygen is not mixed in nitrogen gas 33, the oxidation of lead frame 34 will not be promoted.

The shimmer 32 that would stay below ring illumination 25, at the inner side of ring illumination 25, and inside lens barrel 29 can thus be eliminated in advance by shimmer prevention blow mechanism 31. Thus with bonding device 21, even if a lead frame 34 is set on the setting base 22 for a long time, nitrogen gas can be filled during the wire bonding process to prevent oxidation. Since the surface of lead frame 34 will therefore not become oxidized, the reflectivity will be good in the process of pattern recognition and the recognition precision can be improved.

Furthermore, though when the lead frame 34 surface becomes oxidized, an antioxidant film that can accommodate for temperatures up to 150° C., for example, can become peeled and make the adhesiveness with resin poor, this problem can also be resolved. The bonding device will thus be one by which anti-moisture property and anti-peeling property can also be improved.

Furthermore, the shimmer 32, which is caused by the temperature difference with room temperature when the nitrogen gas that has been heated inside cover 23 blows to the exterior via working hole 24 due to the ascending air current within cover 23, can be eliminated by the shimmer prevention blow mechanism 31 that is disposed at the above-described position. Shimmer 32 will thus not enter into the inner side of ring illumination 25, enabling pattern recognition to be carried out at a high precision of the p order by the recognition camera and wire bonding to be carried out at high precision as well.

Lastly, the characteristic of this invention, that is, the insulation treatment of peripheral part 471 of the working hole 24 of plate 47 that makes up cover 23 shall be described with reference to FIGS. 4 through 6.

Figure 4A:
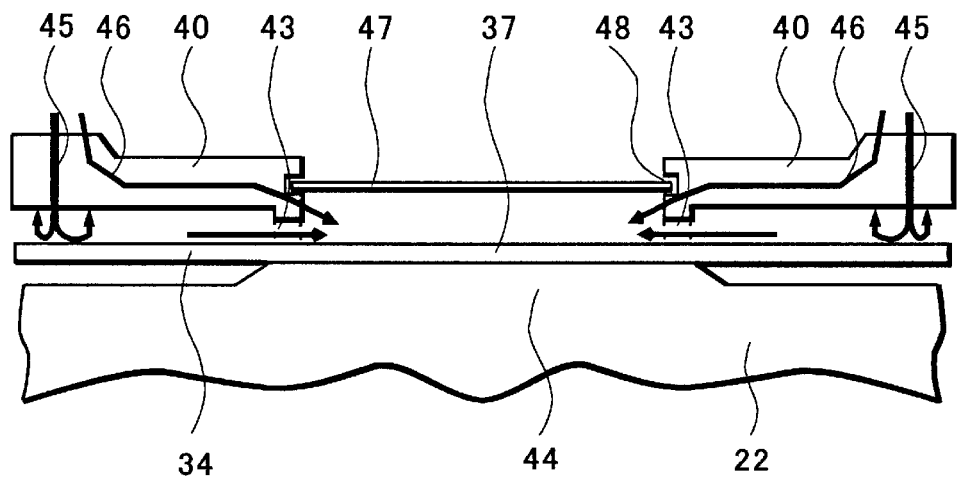
FIG. 4 is a diagram for explaining bonding device provided with recognition device according to the invention.

As shown in FIG. 4(A), cover 23 is formed of damper 40 and stainless-steel plate 47. This plate 47 is fitted inside recessed parts 48 at the upper part of the damper and is free to move in a direction that is horizontal with respect to the surface of damper 40 and perpendicular to the direction to the direction of movement of lead frame 34. Working hole 24 is formed in plate 47, and pattern recognition and wire bonding are performed on block 37 by this working hole 24 moving in correspondence to the mounting parts in the row direction on lead frame 34.

In the following, since cover 23 is formed of damper 40 and plate 47, the abovementioned symbol 231 is matched with the symbol 471.

First the actions of bonding device 21 shall be described briefly below.

As shown in FIG. 4(A), with bonding device 21, damper 40 is disposed above setting base 22 and the peripheral ends of block 37 of lead frame 34 is pressed by means of damper 40 to bring lead frame 34 into close contact with a heating block 44 on the surface of setting base 22. Pattern recognition of lead frame 34, fixed on heat block 44, is then performed via working hole 24 and by means of the recognition camera inside lens barrel 29. Though not illustrated, after pattern recognition, thermocompression ball bonding and ultrasonic wedge bonding of the emitter electrodes of the respective mounting parts inside block 37 to a conductive pattern and the base electrodes to a conductive pattern are performed.

Figure 4B:
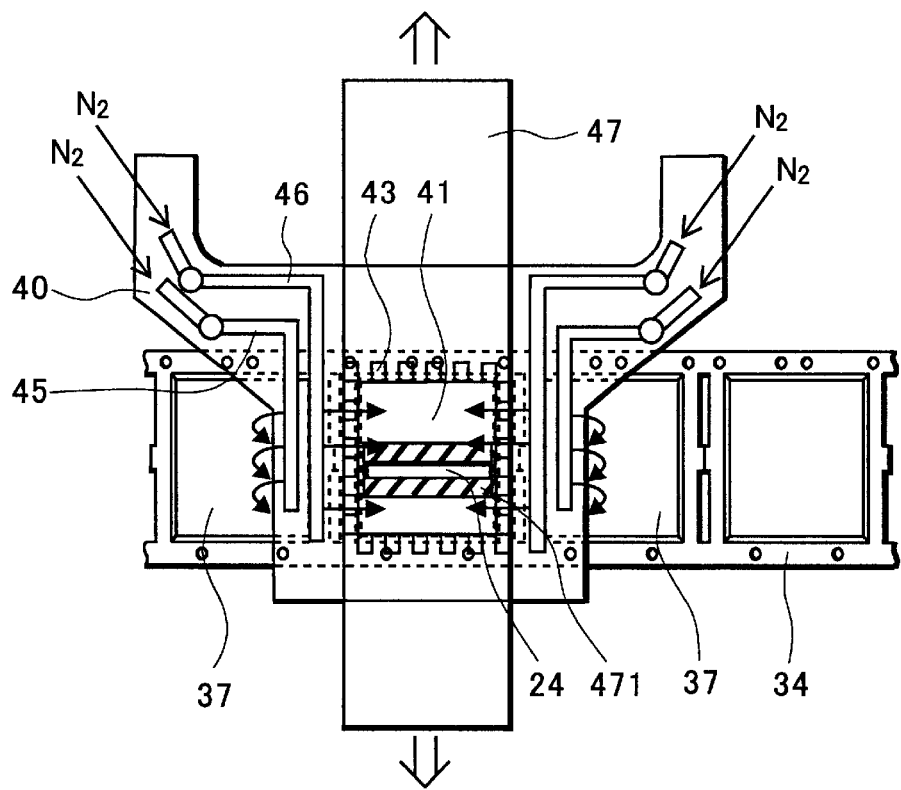

Here, as shown in FIG. 4(B), damper 40 has an opening 41 of substantially the same size as block 37 and is provided with protruding and recessed parts 43 at parts that contact lead frame 34. By holding down the peripheral edges of block 37 by means of protruding and recessed parts 43, the rear surface of block 37 is put into close contact with heating block 44. The interior of damper 40 is provided with paths 45 and 46 for the flow of nitrogen gas.

Since a plurality of mounting parts exist within block 37 and wire bonding is performed in a batch according to each block 37, the duration for which block 37 is heated will be longer in comparison to that of the prior-art circuit device manufacturing method and oxidation of block 37 may thus occur. In order to resolve this problem, nitrogen gas is blown onto the surface of block 37 from damper 40, and, at the same time, the interior of the working region formed by damper 40 and plate 47 is filled with nitrogen gas as has been described above.

The relationship among the working hole 24, provided in plate 47, capillary 27, and torch electrode 28 shall now be described with reference to FIG. 5.

Figure 5A:
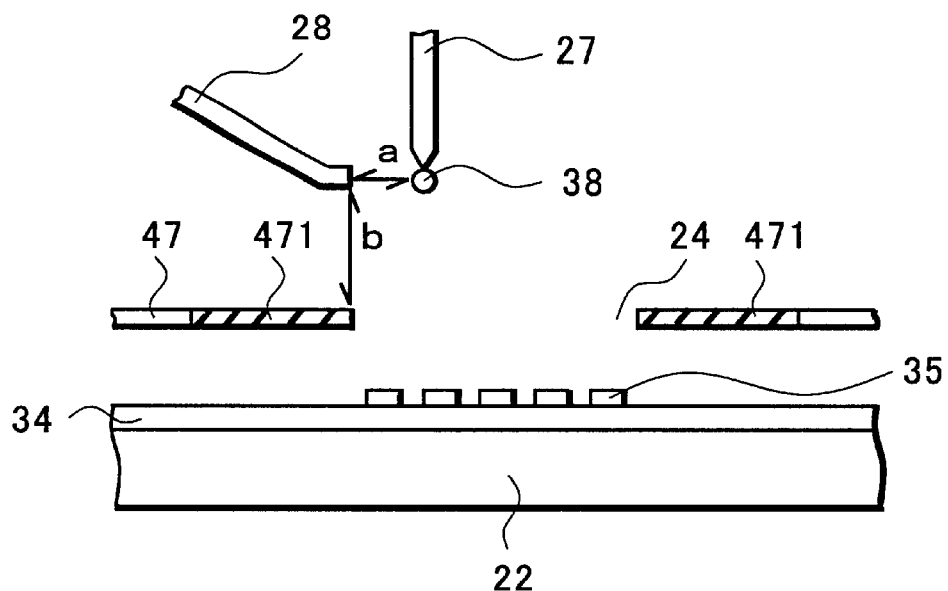
FIG. 5 is a diagram for explaining bonding device provided with recognition device according to the invention.

As shown in FIG. 5(A), capillary 27 and torch electrode 28 are disposed above working hole 24 provided in plate 47. And as has been described above, based on the data obtained by the recognition camera, capillary 27 enters into the working region from working hole 24 to perform wire bonding of the electrode pads of semiconductor elements 25 to the desired electrode patterns. In this process, voltage is applied across torch electrode 28 and capillary 27 to perform stitch bonding and forming of a ball 38 at the tip of a thin metal wire 36 that has been cut.

Since plate 47 is made of stainless steel, if, as shown in the Figure, the distance between the tip of capillary 27 and torch electrode 28 is a and the distance between torch electrode 28 and an edge part of plate 47 at which working hole 24 is formed is b, the work of causing a spark across the tip of capillary 27 and torch electrode 28 without fail and thereby forming ball 38 at the tip of thin metal wire 36 is performed by satisfying the relationship, a>b. That is, since plate 47 is made of conductive material, if the relationship between a and b is such that a<b, sparking will occur across torch electrode 28 and the edge part of plate 47 at which working hole 24 is formed and disable the work of forming ball 38 at the tip of thin metal wire 36.

However, as was mentioned above, with this invention's bonding device 21, the interior of the working region is kept, for example, at 230° C. by the function of heater 30 built into setting base 22. Thus even if nitrogen gas is blown in, for example, at 70° C., the nitrogen gas will be heated to 230° C. by heater 30 and will blow out from the working hole due to the ascending air current inside the working region. Since the plate 47 in which working hole 24 is formed is thus constantly exposed to nitrogen gas that has been heated to 230° C., the parts of plate 47 at the periphery of working hole 24 warp upward over long period of use. As a result, the above-described relationship between a and b becomes such that a<b, thus causing the problem that sparking occurs across torch electrode 28 and the edge part of plate 47 at which working hole 24 is formed.

Figure 6:
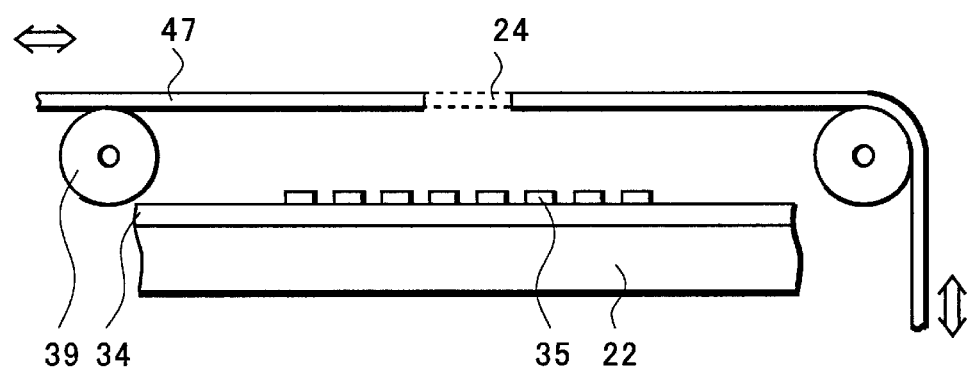
FIG. 6 is a diagram for explaining bonding device provided with recognition device according to the invention.
Figure 7:
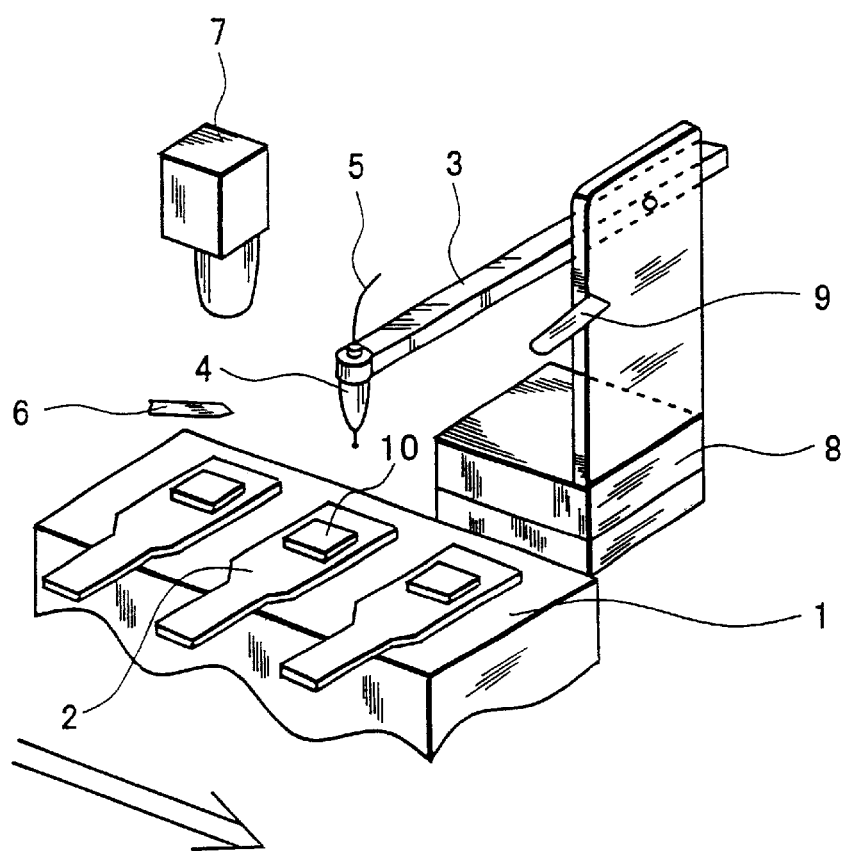
FIG. 7 is a diagram for explaining a bonding device provided with recognition device of the prior art.

Furthermore as shown in FIG. 6, plate 47 has a thickness for example of 50 μm, rollers 39 are disposed at front and rear parts of damper 40, and plate 47 is enabled by these rollers 39 to move in a direction perpendicular to the direction of movement of lead frame 34. Working hole 24 is formed to a size by which, for example, 2 rows of mounting parts of a single cluster block 37 can be recognized from above and pattern recognition and wire bonding are performed in a batch by sliding working hole 24. Since the part at which working hole 24 is formed thus moves to immediately before a roller 39, the plate 47 in which working hole 24 warps upward readily. As a result, the above-described relationship between a and b becomes such that a<b, and sparking thus occurs across torch electrode 28 and the edge part of plate 47 at which working hole 24 is formed.

As has been described above, the problem of upward warping of plate 47, in which working hole 24 is formed, is caused by work, which is essential to carrying out the wire bonding process. Thus this invention's bonding device is characterized in that insulation treatment is applied to a region 471 of plate 47, which is hatched with diagonal lines. To be more specific, tape, comprising a fluororesin, that is for example, a Teflon (registered trademark) tape is attached or a heat-resistant, non-conductive tape is attached to the region 471 of plate 47, which is hatched with diagonal lines. Also, the region 471 of plate 47, which is hatched with diagonal lines is coated with an insulating layer, comprising a fluororesin, for example, a Teflon (registered trademark) coat or a heat-insulating coat. Also, a ceramic plate or other insulating plate is adhered onto the region 471 of plate 47, which is hatched with diagonal lines. Thus even though the above-described relationship between a and b will be such that a<b, since the peripheral part 471 of the part of plate 47 at which working hole 24 is formed is subject to insulation treatment, inadvertent sparking will not occur. A bonding device can thus be realized with which inadvertent sparking can be prevented without obstructing the merits of prevention of oxidation of the surface of lead frame 34, improvement of the bonding speed by the moving of working hole 24, etc.

Though the case where insulation treatment is applied so as to surround the working hole 24 formed in plate 47 is illustrated in the drawings, the problem of inadvertent sparking due to the abovementioned relationship, a<b, can be resolved by applying insulation treatment just to the periphery of working hole 24 with the side edge closest to the tip of torch electrode 28.

Figure 5B:
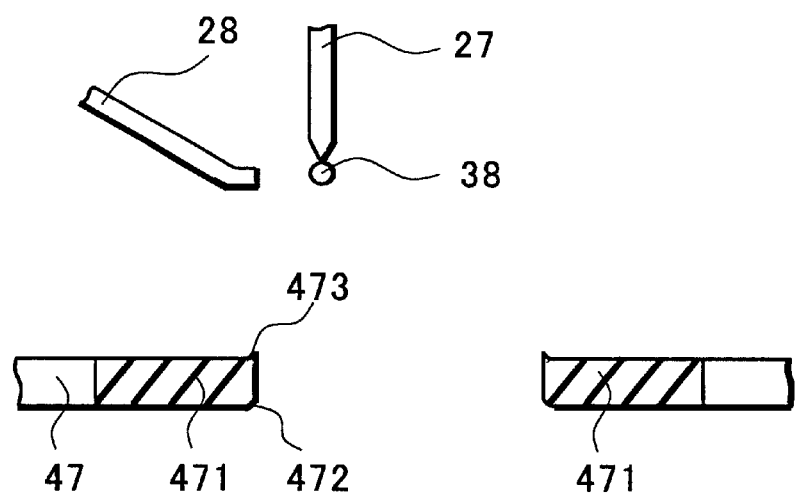

This invention's bonding device 21 is also characterized in that the side that is punched in the process of forming working hole 24 is positioned at the inner surface side of the working region as shown in FIG. 5(B). To be more specific, a curved surface 472, which is formed when working hole 24 is formed, is positioned at the inner surface side of the working region of plate 47 and a protruding part 473, which is formed when working hole 24 is formed, is positioned at the side opposite the inner surface of the working region of plate 47. The height of the working region that is formed by damper 40 and plate 47 is approximately 5 mm and plate 47 warps upward from the plate 47 surface by approximately 2 mm. Though if plate 47 droops downward into the working region, the above-described inadvertent sparking can be prevented, there is the problem that the working region is narrowed by the downward drooping plate 47.

By making the surface that is punched in the process of forming working hole 24 in plate 47 be positioned at the inner surface side of the working region as in the structure of this invention, even when a factor, due to high temperature, etc., that causes plate 47 to warp upward is applied, plate 47 can be made to warp upwards above the working region. A bonding device can thus be realized with which the working region formed by damper 40 and plate 47 will be secured constantly and there are no problems of bending of a thin metal wire within the working region due to the warped plate 47.

Though wire bonding was described in detail with the present embodiment, equivalent effects can also be provided in die bonding, etc., using an optical recognition device. Also, the object that is set on the setting base is not limited to a lead frame, and equivalent effects can be obtained for any object with which the oxidation of conductive foil, etc., needs to be prevented. Applications to devices that are provided with optical recognition devices and are used for the die bonding, wire bonding, or partial coating of soldered parts of metal substrates, printed substrates, ceramic substrates, etc., are also possible. Various other modifications are also possible within a range that does not fall outside the gist of this invention.

What is claimed is:

1. A bonding device comprising:
   a substrate setting base;
   a cover, which covers a working region from above the substrate setting base;
   a working hole, provided in an upper surface of the cover;
   a capillary and a torch electrode;
   wherein a part of the cover at a periphery of the working hole is provided with insulation to prevent sparking across the torch electrode and the cover.

2. The bonding device according to claim 1, wherein the cover has the insulation only at the periphery of the working hole with a side edge closest to a tip of the torch electrode.

3. The bonding device according to claim 1, wherein the insulation for the cover comprises heat-resistant insulating tape.

4. The bonding device according to claim 3, wherein the heat-resistant insulating tape is tape comprising a fluororesin.

5. The bonding device according to claim 1, wherein the insulation for the cover includes an insulating layer comprising a fluororesin.

6. The bonding device according to claim 1, wherein the insulation for the cover includes an insulating plate.

7. The bonding device according to claim 6, wherein the insulating plate is a ceramic plate.

8. The bonding device according to claim 1, wherein a curved surface of the cover is provided at an inner surface side of the working region of the cover and a protruding part of the cover is provided at a side opposite the inner surface side of the cover.

9. A bonding device comprising:
   a substrate setting base;
   a cover, which covers a working region from above the substrate setting base;
   a working hole, provided in an upper surface of the cover;
   a capillary and a torch electrode; wherein
   the cover is arranged by covering an upper surface of a damper with a conductive plate, wherein a part of the conductive plate at a periphery of the working hole includes insulation to prevent sparking across the torch electrode and the conductive plate.

10. The bonding device according to claim 9, wherein the conductive plate has the insulation only at the periphery of the working hole with a side edge closest to a tip of the torch electrode.

11. The bonding device according to claim 9, wherein the insulation for the conductive plate includes an insulating layer comprising a fluororesin.

12. The bonding device according to claim 9, wherein a curved surface of the cover is provided at an inner surface side of the working region of the cover and a protruding part of the cover is provided at a side opposite the inner surface side of the cover.

13. The bonding device according to claim 9, wherein the insulation for the conductive plate is carried out by adhesion of an insulating plate.

14. The bonding device according to claim 13, wherein the insulating plate is a ceramic plate.

15. The bonding device according to claim 9, wherein the insulation for the conductive plate includes a heat-resistant insulating tape.

16. The bonding device according to claim 15, wherein the heat-resistant insulating tape is tape comprising a fluororesin.

17. The bonding device according to claim 9, wherein the conductive plate comprises stainless steel.

18. A bonding device comprising:
    a substrate setting base, having a heating function;
    a cover, which covers a working region from above the substrate setting base;
    a working hole, provided in an upper surface of the cover;
    an illumination device, disposed above the working hole;
    a capillary and a torch electrode, disposed at a periphery of the illumination device; and
    a pattern recognition camera, disposed inside a lens barrel provided above the illumination device;
    wherein a part of the cover at a periphery of the working hole is provided with insulation to prevent sparking across the torch electrode and the cover.

19. A bonding device comprising:
    a substrate setting base, having a heating function;
    a cover, which covers a working region from above the substrate setting base;
    a working hole, provided in an upper surface of the cover;
    an illumination device, disposed above the working hole;
    a capillary and a torch electrode, disposed at a periphery of the illumination device; and
    a pattern recognition camera, disposed inside a lens barrel provided above the illumination device; wherein
    the cover is arranged by covering an upper surface of a damper with a conductive plate, wherein a part of the conductive plate at a periphery of the working hole is provided with insulation to prevent sparking across the torch electrode and the conductive plate.

* * * * *